(12) United States Patent
Long et al.

(10) Patent No.: US 9,634,043 B2
(45) Date of Patent: Apr. 25, 2017

(54) ARRAY SUBSTRATE, MANUFACTURING METHOD THEREOF, DISPLAY DEVICE, THIN-FILM TRANSISTOR (TFT) AND MANUFACTURING METHOD THEREOF

(71) Applicant: BOE TECHNOLOGY GROUP CO., LTD., Beijing (CN)

(72) Inventors: Chunping Long, Beijing (CN); Jang Soon Im, Beijing (CN); Chien Hung Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 74 days.

(21) Appl. No.: 14/436,563

(22) PCT Filed: Sep. 20, 2014

(86) PCT No.: PCT/CN2014/087000
§ 371 (c)(1),
(2) Date: Apr. 17, 2015

(87) PCT Pub. No.: WO2015/180310
PCT Pub. Date: Dec. 3, 2015

(65) Prior Publication Data
US 2016/0300866 A1 Oct. 13, 2016

(30) Foreign Application Priority Data
May 27, 2014 (CN) .......................... 2014 1 0226956

(51) Int. Cl.
*H01L 29/786* (2006.01)
*H01L 29/423* (2006.01)
(Continued)

(52) U.S. Cl.
CPC ........ *H01L 27/1274* (2013.01); *G02F 1/1368* (2013.01); *G02F 1/134363* (2013.01);
(Continued)

(58) Field of Classification Search
CPC ............ H01L 27/1225; H01L 27/1288; H01L 29/78633; H01L 29/78648; H01L 29/78696
See application file for complete search history.

(56) References Cited

U.S. PATENT DOCUMENTS

2011/0299005 A1 12/2011 Takeguchi et al.
2012/0120362 A1 5/2012 Choi et al.
2016/0260843 A1* 9/2016 Choi ................. H01L 29/78633

FOREIGN PATENT DOCUMENTS

CN 102683338 A 9/2012
CN 202601619 U 12/2012
(Continued)

OTHER PUBLICATIONS

Feb. 2, 2015—(WO)—International Search Report and Written Opinion PCT/CN2014/087000 English Tran.

*Primary Examiner* — Cuong Q Nguyen
(74) *Attorney, Agent, or Firm* — Banner & Witcoff, Ltd.

(57) ABSTRACT

An array substrate, a manufacturing method thereof, a display device, a thin-film transistor (TFT) and a manufacturing method thereof are disclosed. The method for manufacturing the TFT comprises: forming a pattern of an active layer and a gate insulating layer provided with a metal film on a base substrate patterning the metal film by one patterning process, and forming patterns of a gate electrode a source electrode, a drain electrode a gate line and a data line; forming a passivation layer on the base substrate; patterning the passivation layer by one patterning process, and forming a source contact hole, a drain contact hole and a bridge structure contact hole; and forming a transparent conductive film on the base substrate, and removing partial transparent conductive film to form a source contact portion, a drain contact portion, a pixel electrode and a bridge structure.

11 Claims, 8 Drawing Sheets

(51) Int. Cl.
*H01L 27/12* (2006.01)
*H01L 21/77* (2017.01)
*G02F 1/1343* (2006.01)
*G02F 1/1362* (2006.01)
*G02F 1/1368* (2006.01)
*H01L 27/32* (2006.01)

(52) U.S. Cl.
CPC ........ *G02F 1/136286* (2013.01); *H01L 21/77* (2013.01); *H01L 27/12* (2013.01); *H01L 27/124* (2013.01); *H01L 27/1288* (2013.01); *H01L 27/3248* (2013.01); *G02F 2001/13625* (2013.01); *G02F 2001/136231* (2013.01)

(56) References Cited

FOREIGN PATENT DOCUMENTS

| | | |
|---|---|---|
| CN | 103123910 A | 5/2013 |
| CN | 104022076 A | 9/2014 |
| CN | 104022077 A | 9/2014 |

* cited by examiner 101 102 103 106 105 107 104
116 110 112 113 111 115

201

201 202

ARRAY SUBSTRATE, MANUFACTURING METHOD THEREOF, DISPLAY DEVICE, THIN-FILM TRANSISTOR (TFT) AND MANUFACTURING METHOD THEREOF

The application is a U.S. National Phase Entry of International Application No. PCT/CN2014/087000 filed on Sep. 20, 2014, designating the United States of America and claiming priority to Chinese Patent Application No. 201410226956.3 filed on May 27, 2014. The present application claims priority to and the benefit of the above-identified applications and the above-identified applications are incorporated by reference herein in their entirety.

TECHNICAL FIELD

At least one embodiment of the present invention relates to an array substrate, a manufacturing method thereof, a display device, a thin-film transistor (TFT) and a manufacturing method thereof.

BACKGROUND

An active matrix display device is a display device utilizing TFTs for pixel display drive, has the advantages of light weight, low power consumption, low radiation, low cost and the like, and is one of the mainstream display technologies at present.

An active matrix display device comprises a TFT array substrate. Based on different materials for forming active layers of TFTs, the TFT array substrate may be divided into a variety of types such as hydrogenated amorphous silicon (a-Si: H) type, low-temperature polysilicon (LTPS) type, high-temperature polysilicon (HTPS) type or oxide semiconductor type etc. LTPS TFT array substrates have become one of the research hotspots in the current field due to the advantages of high carrier mobility, high integrate capability, strong anti-interference, etc.

An LTPS TFT array substrate generally comprises a plurality of gate lines along a first direction and a plurality of data lines along a second direction to define and form a plurality of pixel units arranged in a matrix, and the first direction and the second direction are perpendicular to each other. As illustrated in FIG. 1, each pixel unit includes: a pixel electrode 115, a storage electrode 104 disposed beneath the pixel electrode 115, and a TFT disposed at an intersection of a gate line (not shown in the figure) and a data line (not shown in the figure), and the TFT is connected with the pixel electrode 115 and configured to drive the pixel electrode. The TFT includes an active layer 103, a gate electrode 106, a source electrode 110 and a drain electrode 111. In general, the gate electrode 106 is connected with the gate line; the source electrode 110 is connected with the data line; and the drain electrode 111 is connected with the pixel electrode 115.

The method for manufacturing the LTPS TFT array substrate generally comprises: on a base substrate 101 forming a buffer layer 102, patterns of active layers 103 and storage electrodes 104, a gate insulating layer 105, patterns of gate electrodes 106 and gate lines, an interlayer insulating layer 107, source contact holes and drain contact holes, patterns of source electrodes 110, drain electrodes 111 and data lines, a passivation layer 112, pixel electrode contact holes in the passivation layer, a planarization layer 113, pixel electrode contact holes in the planarization layer 113 (communicated with the pixel electrode contact holes in the passivation layer 112), pixel electrodes 115 and a pixel define layer 116 in sequence. The method further comprises: forming a photoresist pattern that shields active layers 103 but exposes the storage electrodes 104, after forming the patterns of the active layers 103 and the storage electrodes 104, to realize the ion doping to the storage electrodes 104, and then removing the photoresist pattern.

SUMMARY

At least one embodiment of the present invention provides an array substrate, a manufacturing method thereof, a display device, a TFT and a manufacturing method thereof to simplify the method for manufacturing the array substrate, enhance the productivity and improve the yield of the array substrate.

At least one embodiment of the present invention provides a method for manufacturing an array substrate, which comprises: forming a pattern of an active layer and a gate insulating layer on a base substrate; forming a metal film on the gate insulating layer, patterning the metal film by one patterning process, and forming patterns of a gate electrode, a source electrode, a drain electrode, a gate line and a data line, in which the gate line or the data line is disconnected at an intersection of the gate line and the data line; forming a passivation layer on the base substrate; patterning the passivation layer by one patterning process, and forming a source contact hole through which the source electrode and the active layers are partially exposed, a drain contact hole through which the drain electrodes and the active layers are partially exposed, and bridge structure contact holes through which the disconnected gate line or data line is partially exposed; and forming a transparent conductive film on the base substrate, removing partially the transparent conductive film to form a source contact portion electrically connected with the source electrode and the active layer in the source contact hole and a drain contact portion electrically connected with the drain electrode and the active layer in the drain contact hole, forming a pixel electrode electrically connected with the drain contact portion on the passivation layer on the drain electrode, and forming a bridge structure electrically connected with the disconnected gate line or data line in the bridge structure contact holes and on the passivation layer above.

At least one embodiment of the present invention further provides an array substrate, which comprises: an active layer disposed on a base substrate; a gate insulating layer for covering the active layer; a gate electrode, a source electrode, a drain electrode, a gate line and a data line disposed on the gate insulating layer and arranged in a same layer, in which the gate line or the data line is disconnected at an intersection of the gate line and the data line; a passivation layer for covering the gate electrode, the source electrode, the drain electrode, the gate line and the data line; a source contact hole, a drain contact hole and bridge structure contact holes disposed in the passivation layer and the gate insulating layer, in which the source electrode and the active layer are partially exposed by the source contact hole, the drain electrode and the active layers are partially exposed by the drain contact hole, the disconnected gate line or data line is partially exposed by the bridge structure contact holes; and a source contact portion, a drain contact portion, a pixel electrode and a bridge structure arranged in the same layer. The source contact portion is disposed in the source contact hole and electrically connected with the source electrode and the active layer; the drain contact portion is disposed in the drain contact hole and electrically connected with the drain electrode and the active layer; the pixel electrode is disposed on the passivation layer on the drain electrode and electrically connected with the drain electrode through the drain contact portion; and the bridge structure is disposed in the bridge structure contact holes and on the passivation layer and electrically connected with the disconnected gate line or data line.

At least one embodiment of the present invention further provides a display device which comprises the foregoing array substrate.

At least one embodiment of the present invention further provides a TFT, which comprises: an active layer disposed on a base substrate; a gate insulating layer for covering the active layer; a gate electrode, a source electrode and a drain electrode disposed on the gate insulating layer and arranged in the same layer; a passivation layer for covering the gate electrode, the source electrode and the drain electrode; a source contact hole and a drain contact hole disposed in the passivation layer and the gate insulating layer, in which the source electrode and the active layer are partially exposed by the source contact hole, and the drain electrode and the active layer are partially exposed by the drain contact hole; and a source contact portion and a drain contact portion arranged in the same layer, in which the source contact portion is disposed in the source contact hole and electrically connected with the source electrode and the active layer, and the drain contact portion is disposed in the drain contact hole and electrically connected with the drain electrode and the active layer.

At least one embodiment of the present invention further provides a method for manufacturing a thin film transistor (TFT), which comprises: forming a pattern of an active layer and a gate insulating layer on a base substrate; forming a metal film on the gate insulating layer, patterning the metal film by one patterning process, and forming patterns of a gate electrode, a source electrode and a drain electrode; forming a passivation layer on the base substrate; patterning the passivation layer by one patterning process, and forming a source contact hole through which the source electrode and the active layer are partially exposed and a drain contact hole through which the drain electrode and the partial active layer are partially exposed; and forming a conductive film on the base substrate, removing partially conductive film, and forming a source contact portion electrically connected with the source electrode and the active layer in the source contact hole and a drain contact portion electrically connected with the drain electrode and the active layer in the drain contact hole.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Figure 1:
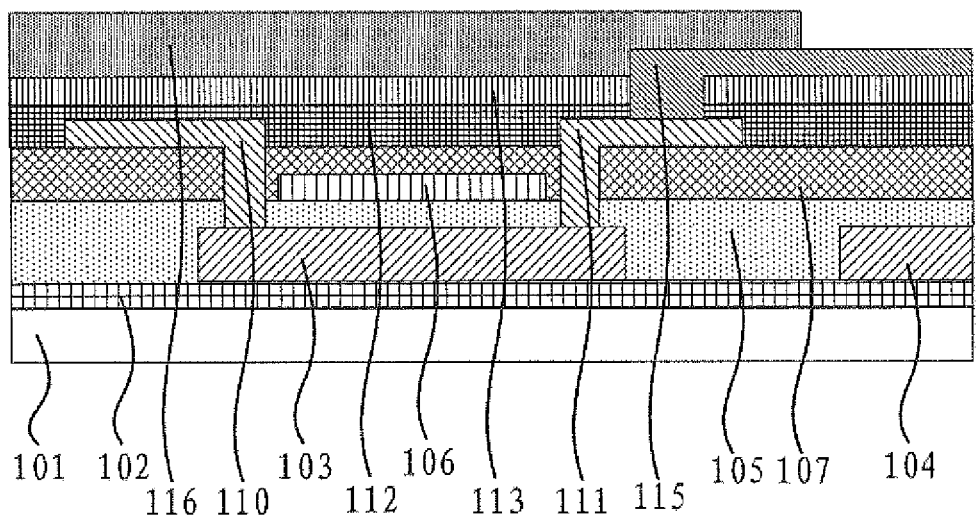
FIG. 1 is a schematic structural view of a TFT array substrate.

The inventors of the present application have noted that: the entire manufacturing process of the array substrate as shown in FIG. 1 requires at least 8 to 9 patterning processes, but each patterning process includes a plurality of processes such as photoresist application, exposure, development, cleaning and etc., and hence the manufacturing steps of the array substrate are very complicated and the productivity is very low. In addition, higher alignment accuracy is required in the patterning process, but high-accuracy alignment is very difficult, and hence alignment error will directly result in the reduced yield of products.

First Embodiment

The present embodiment of the present invention provides a method for manufacturing an array substrate. The method comprises the following steps.

Figure 2:
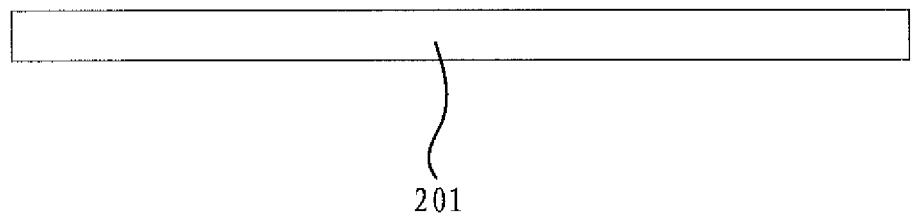
FIGS. 2 to 13 are schematic diagrams illustrating the steps of a method for manufacturing an array substrate provided by a first embodiment of the present invention.

S21: providing a base substrate 201, as shown in FIG. 2.

In order to ensure better performances of products, for instance, the base substrate 201 may be initially cleaned to remove residual foreign particles on the surface of the base substrate in the manufacturing process.

The material of the provided base substrate 201 may be determined according to actual conditions. When a display device to be manufactured is not flexible, the base substrate 201, for instance, may adopt a glass substrate. When a flexible display device is to be manufactured, the base substrate 201, for instance, may be made from a flexible material such as a plastic film.

Figure 3:
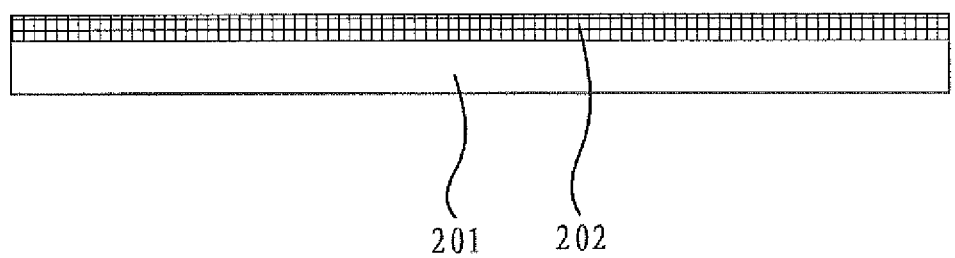

S22: forming a buffer layer 202 on the base substrate 201, as shown in FIG. 3.

For instance, a silicon nitride film and a silicon oxide film may be formed on the base substrate 201 in sequence by plasma enhanced chemical vapor deposition (PECVD) or other processes, and the laminated layer of the two thin film layers is used as the buffer layer 202. The thickness of the silicon nitride is, for instance, 50 nm to 100 nm, and the thickness of the silicon oxide is, for instance, 100 nm to 400 nm. The silicon nitride film has strong diffusion resistance and can prevent metallic ions from affecting a subsequently formed poly-Si film. The silicon oxide film can form a good interface together with the subsequently formed poly-Si film, and hence the damage of the silicon nitride film on the quality of the poly-Si film can be avoided.

It should be noted that the thickness of film layers in the buffer layer 202 is only within the illustrative range provided by the embodiment. In other embodiments of the present invention, the thickness of the film layers in the buffer layer 202 may be specifically set to be within a range different from the above range according to actual condition.

Moreover, the specific structure of the buffer layer 202 in the embodiment is not limited to be the laminated structure formed by the silicon nitride film and the silicon oxide film and may also be a laminated structure of at least three film layers, and the material for forming the buffer layer 202 is not only limited to the above two types, namely the silicon nitride and the silicon oxide.

Furthermore, the buffer layer 202 may be provided or not, according to actual condition. In other embodiments of the present invention, the buffer layer 202 may be not arranged, namely the step S22 may be omitted.

Figure 4:
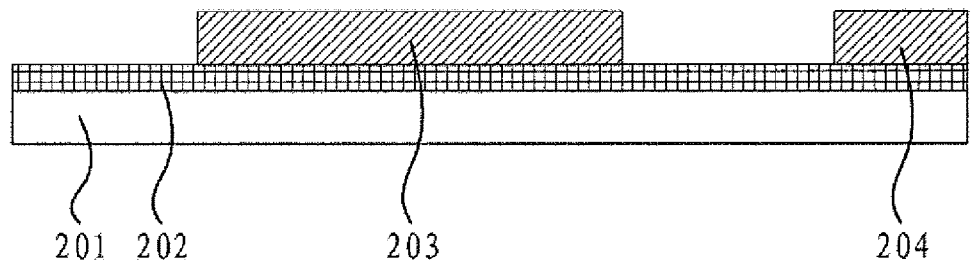

S23: forming a pattern of an active layer 203 on the base substrate, as shown in FIG. 4.

In the embodiment, in the step of forming the pattern of the active layer 203 on the base substrate, for instance, a pattern of a storage electrode 204 may be also formed at the same time. The process, for instance, may be as follows: forming a poly-Si layer on the base substrate, patterning the poly-Si layer by one patterning process, and forming the pattern of the active layer 203 and the pattern of the storage electrode 204.

The step of forming the poly-Si layer on the base substrate, patterning the poly-Si layer, and forming the pattern of the active layer 203 and the pattern of the storage electrode 204, for instance, may include the following steps S231 to S235.

Figure 14:
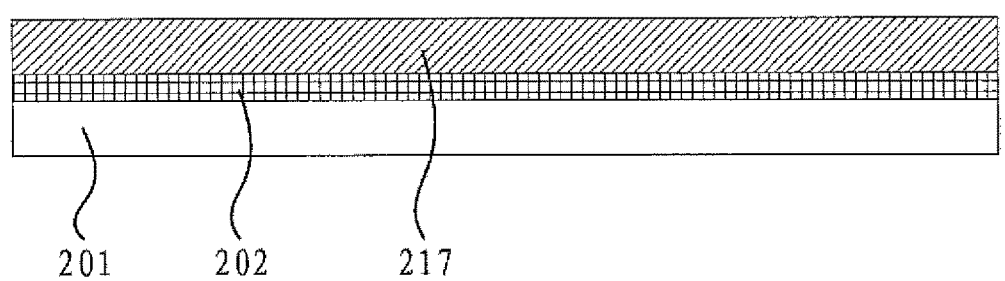
FIGS. 14 to 18 are schematic diagrams illustrating the steps of forming an active layer and a storage electrode in the method for manufacturing the array substrate provide by the first embodiment of the present invention.

S231: forming a poly-Si layer 217 on the base substrate, as shown in FIG. 14.

At first, a-Si materials are deposited on one side of the base substrate by deposition process such as sputtering and PECVD, and the thickness of the deposited a-Si materials is, for instance, 40 nm to 100 nm. Subsequently, the a-Si material is subjected to a crystallization process such as laser annealing crystallization, meta-induced crystallization and solid-phase crystallization and converted into poly-Si materials, and hence the poly-Si layer 217 is formed.

After the deposition of the a-Si material and before the crystallization process, for instance, the a-Si material may be subjected to dehydrogenation process by a heat treatment furnace to prevent hydrogen explosion in the subsequent crystallization process.

In addition, after the crystallization process is completed, for instance, the formed poly-Si layer 217 may be cleaned by a diluted hydrofluoric acid solution to reduce the surface roughness of the poly-Si layer 217.

Figure 15:
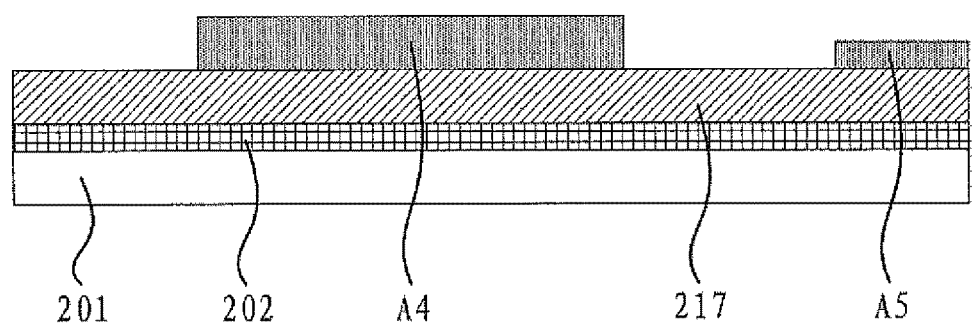

S232: forming a fourth photoresist layer A4 for covering an active layer region to be formed and a fifth photoresist layer A5 for covering a storage electrode region to be formed on the poly-Si layer 217 via a semi-transparent type mask, as shown in FIG. 15, in which the thickness of the fourth photoresist layer A4 is greater than that of the fifth photoresist layer A5.

In the embodiment, the thickness of the first photoresist A1, for instance, may be 1 μm to 3 μm, and the thickness of the second photoresist A2 is, for instance, 0.5 μm to 1 μm.

Figure 16:
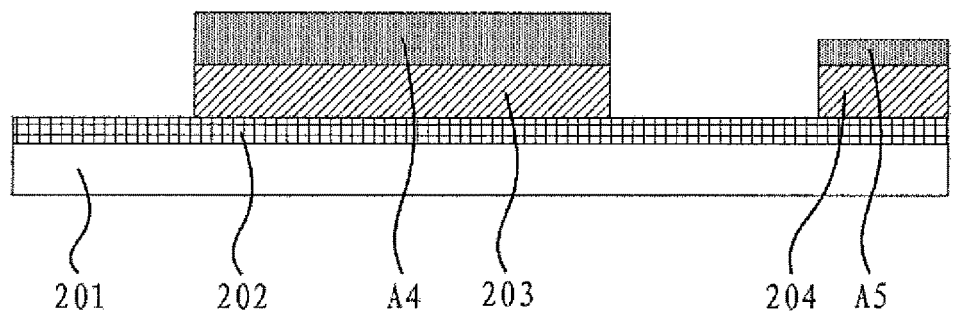

S233: removing the exposed poly-Si layer by taking the fourth photoresist layer A4 and the fifth photoresist layer A5 as a mask, and forming the pattern of the active layer 203 and the pattern of the storage electrode 204, as shown in FIG. 16.

The exposed poly-Si layer described in the step is the poly-Si layer in regions except the active layer region to be formed and the storage electrode region to be formed.

In the above step, the poly-Si layer material may be removed by the process such as inductively coupled plasma etching.

Figure 17:
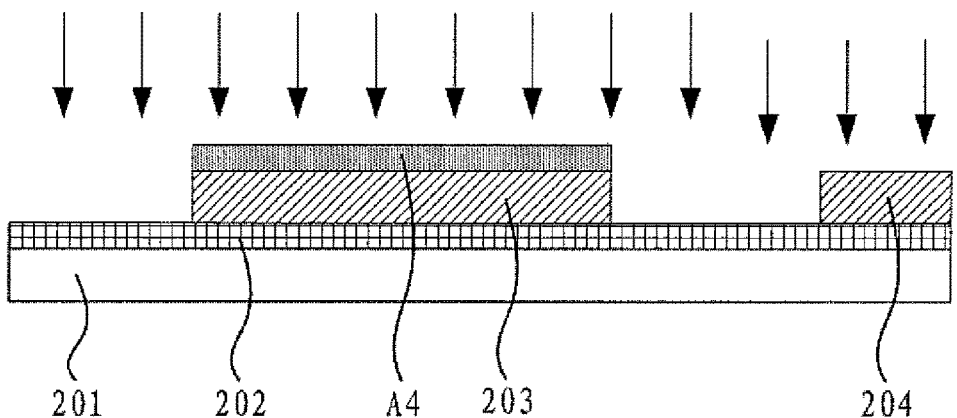

Step S234: removing the fifth photoresist layer A5, and doping the pattern of the storage electrode 204 by taking the fourth photoresist layer A4 as a mask, as shown in FIG. 17.

In the step, for instance, the fifth photoresist layer A5 may be removed by a plasma ashing process. In the process of ashing and removing, a certain amount of the fourth photoresist layer A4 will be also removed at the same time. But as the thickness of the fourth photoresist layer A4 is greater than that of the fifth photoresist layer A5, after the ashing and removing process is completed, there is still a certain thickness of the fourth photoresist layer A4 on the active layer 203 for covering. The residual fourth photoresist layer A4 will be taken as a doping barrier layer of the active layer 203 in the subsequent doping process.

After the fifth photoresist layer A5 are completely removed and the surface of the pattern of the storage electrode 204 is exposed, for instance, the pattern of the storage electrode 204 may be doped by doping method such as ion implantation and ion-cloud implantation. When N-type doping is required, doped ions are, for instance, $PH_3$ and $H_2$. When P-type doping is required, the doped ions are, for instance, $B_2H_6$ and $H_2$. The ion implantation dosage is, for instance, $10^{14}$ to $10^{16}$ ions/cm$^2$, and the ion implantation energy is, for instance, 10 KeV to 100 KeV.

It should be noted that: after the doping process is completed, for instance, the base substrate may be subjected to annealing by a rapid thermal annealing process to activate doped foreign ions, enhance the conductivity of the poly-Si layer, and allow the storage electrode 204 to become a low-resistance conductive film. The annealing process, for instance, may be performed after the step S234 is over.

Figure 18:
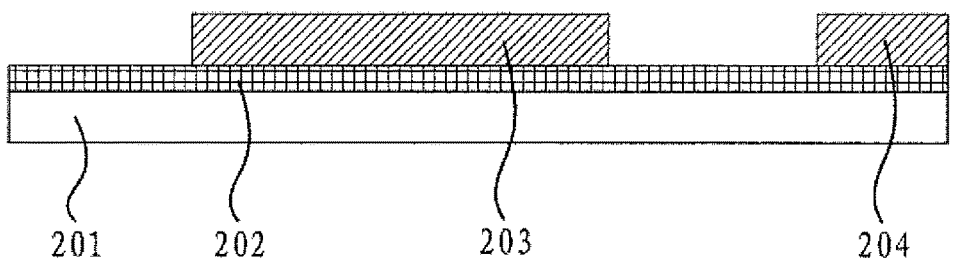

S235: removing the fourth photoresist layer A4, as shown in FIG. 18.

After the storage electrode 204 is formed, for instance, the fourth photoresist layer A4 may be removed by a method such as an etching process and a stripping process via a device such as a plasma etcher and a stripper.

In the embodiment, the patterns of the active layer 203 and the storage electrodes 204 are formed by the steps S231 to S235. Photoresist layers with two different thicknesses are formed on the poly-Si layer 217 via a semi-transparent type mask. The poly-Si layer is etched at first to form the patterns of the active layer 203 and the storage electrode 204, and hence the photoresist layer with a small thickness for covering the pattern of the storage electrode 204 is removed to expose surface of the pattern of the storage electrode 204. As the thickness of the photoresist layer for covering the pattern of the active layer 203 is greater than that of the photoresist layer for covering the pattern of the storage electrode 204, the pattern of the active layer 203 is still shielded/covered by the photoresist layer, and the residual photoresist layer will be taken as the doping barrier layer of the active layer 203 in the subsequent doping process. Subsequently, in the doping process, the pattern of the storage electrode 204 is heavily doped to form a low-resistance conductive layer. Obviously, in the embodiment, the active layer 203 and the storage electrode 204 are formed in only one patterning process, which is equivalent to combination of two photolithographic processes that are used in the etching of the poly-Si layer and the doping of the storage electrode in the method for manufacturing the array substrate as shown in FIG. 1, into one photolithographic process. Therefore, the number of the patterning processes is reduced; the method for manufacturing the array substrate is simplified; the productivity is enhanced; and the yield of products is improved.

It should be noted that: the method for forming the patterns of the active layer 203 and the storage electrode 204, provided by the steps S231 to S235, is only the illustrative method provided by the embodiment of the present invention; and the patterns of the active layer 203 and the storage electrode 204 may be also formed by a conventional method in other embodiments of the present invention on the basis of the concept of the present invention.

Figure 5:
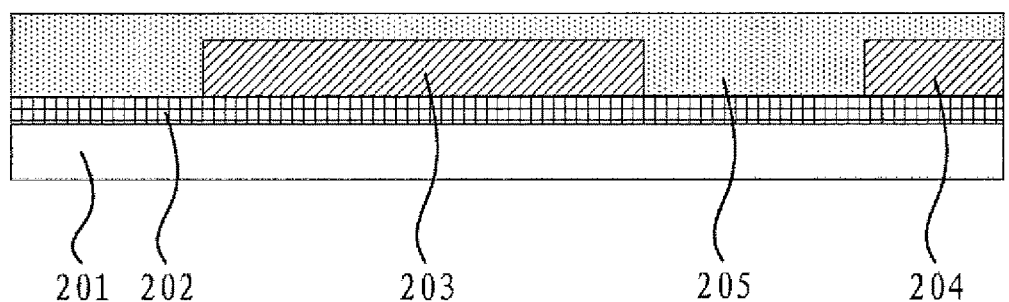

S24: forming a gate insulating layer 205 on the base substrate, as shown in FIG. 5.

The gate insulating layer 205 is formed after the active layer 203 is formed and covers the active layer 203.

The gate insulating layer 205, for instance, may be a laminated structure formed by a silicon oxide film and a silicon nitride film. The silicon oxide is closer to the base substrate compared with the silicon nitride film. The thickness of the silicon oxide film, for instance, may be 30 nm to 100 nm, and the thickness of the silicon nitride film, for instance, may be 20 nm to 100 nm.

In the step, the gate insulating layer 205 may also be a single-layer film structure or a laminated structure of at least three film layers; the thickness of the film layers of the gate insulating layer 205 is not limited to be only within the above illustrative range and may be set according to actual condition; and the material for forming the gate insulating layer 205 may also be an insulating material beside silicon oxide and silicon nitride.

The process for forming the gate insulating layer 205, for instance, may be a process such as PECVD. No limitation will be given here.

Figure 6:
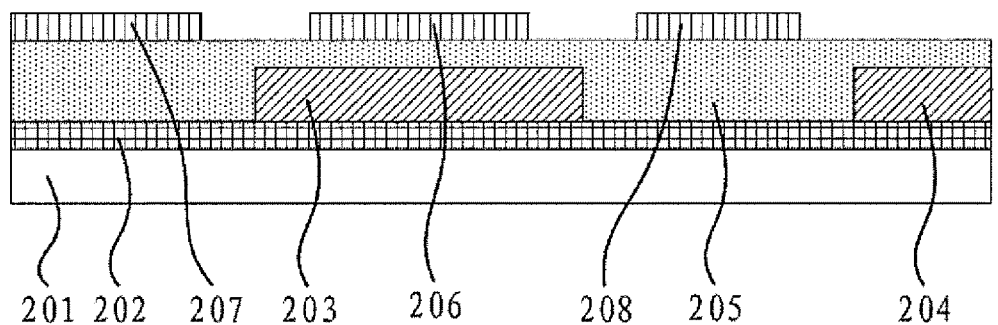

S25: forming a metal film 219 on the gate insulating layer 205, patterning the metal film 219 by one patterning process, and forming patterns of a gate electrode 206, a source electrode 207, a drain electrode 208, a gate line (not shown in the figure) and a data line (not shown in the figure), as shown in FIG. 6, in which the gate line or the data line is disconnected at the intersection between the gate line and the data line.

In the embodiment, the step S25, for instance, may include the following steps S251 to S253.

Figure 19:
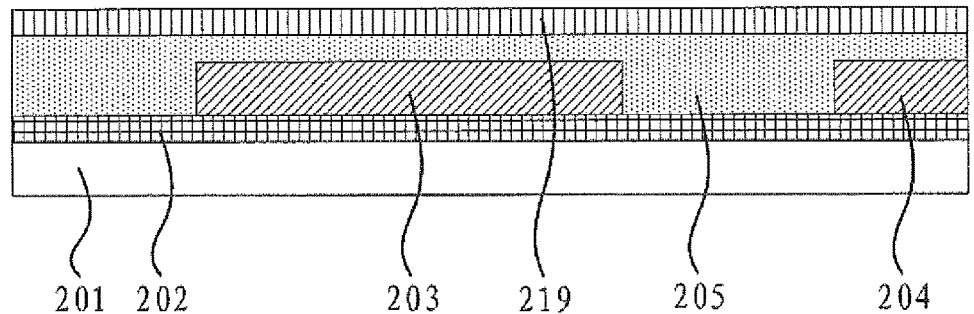
FIGS. 19 to 21 are schematic diagrams illustrating the steps of forming a gate electrode, a source electrode, a drain electrode, a gate line and a data line in the method for manufacturing the array substrate provide by the first embodiment of the present invention.

S251: forming the metal film 219 on the gate insulating layer 205, as shown in FIG. 19.

The step of forming the metal film 219, for instance, may adopt the process such as PECVD and magnetron sputtering. The thickness of the metal film 219 may be set according to actual condition and, for instance, may be 200 nm to 500 nm. The material for preparing the metal film 219, for instance, may include at least one or any combination of more selected from aluminum, copper, molybdenum, titanium and aluminum neodymium compound. The metal film 219 may be a single-layer film structure and may also be a laminated structure formed by thin film layers, e.g., a structure formed by the lamination of three film layers molybdenum, aluminum and molybdenum in sequence and a structure formed by the lamination of three film layers titanium, aluminum and titanium in sequence.

Figure 20:
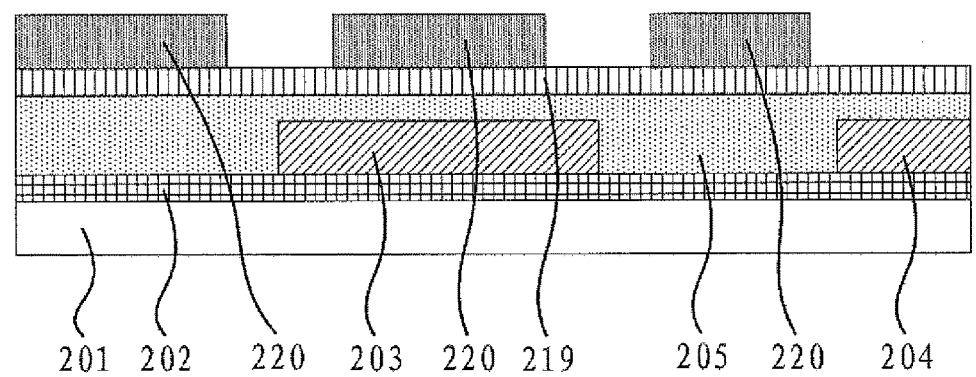

S252: forming a photoresist layer 220 on the metal film 219 corresponding to patterns of the gate electrode, the source electrode, the drain electrode, the gate line and the data line, as shown in FIG. 20, in which the gate line portion or the data line portion in the photoresist layer 220 are disconnected at the intersections of the gate line and the data line.

Figure 21:
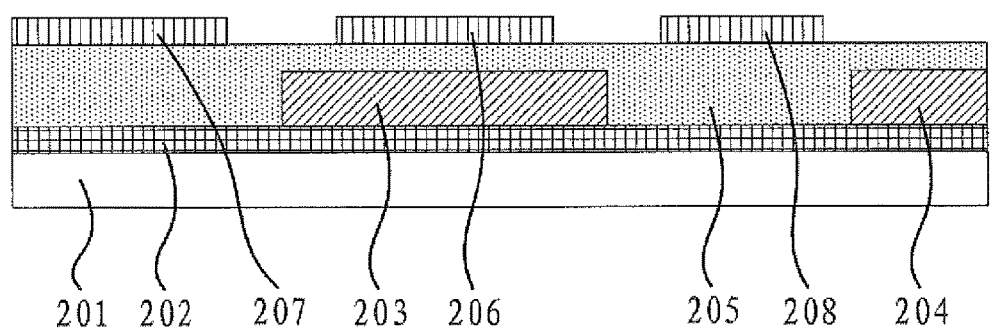

S253: removing the exposed metal film by taking the photoresist layer 220 as a mask, and forming the patterns of the gate electrode 206, the source electrode 207, the drain electrode 208, the gate line and the data line, as shown in FIG. 21, in which the gate line or the data line are disconnected at the intersections of the gate line and the data line.

In the step, the exposed metal film refers to the metal film in regions except the gate electrode region to be formed, the source electrode region to be formed, the drain electrode region to be formed, the gate line region to be formed and the data line region to be formed.

In the step, for instance, the metal film 219 may be etched by a process such as wet etching or dry etching (e.g., inductively coupled plasma etching).

As the gate line and the data line are formed in the same photolithographic step, the gate line and the data line are arranged in the same layer. As the electric insulation between the gate line and the data line is required, the gate line or the data line must be disconnected at the intersection of the gate line and the data line. For instance, the gate line may be continuous and the data line is disconnected at the intersection of the data line and the gate line; or the data line may be continuous and the gate line is disconnected at the intersection of the gate line and the data line. A bridge may be disposed at the intersections of the gate line or the data line for electrical connection in the subsequent step.

It should be noted that the formed gate line is electrically connected with the gate electrode 206 and the data line is electrically connected with the source electrode 207.

After the etching process is completed, the photoresist layers 220 may be removed.

In the steps S251 to S253, the gate electrode 206, the source electrode 207, the drain electrode 208, the gate line and the data line may be formed in the same layer by only one patterning process, which is equivalent to combine two patterning processes, used in the step of forming the gate electrode and the gate line and the step of forming the source/drain electrodes and the data lines in the method for manufacturing the array substrate as shown in FIG. 1, into one patterning process. Therefore, the number of the patterning processes is reduced; the method for manufacturing the array substrate is simplified; the productivity is enhanced; and meanwhile the yield of products is improved.

In addition, in the above method for forming the gate electrode 206, the source electrode 207, the drain electrode 208, the gate line and the data line, the step of forming an interlayer insulating layer between the gate electrode 206 and the source electrode 207 and the drain electrode 208 is omitted. Therefore, the method for manufacturing the array substrate can be further simplified.

Figure 7:
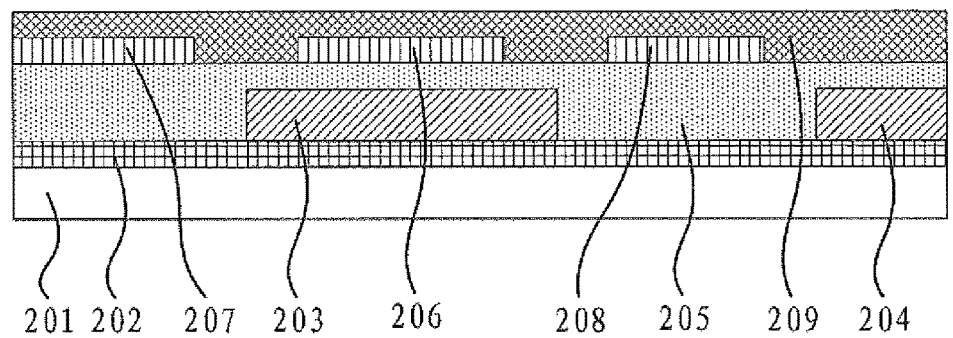

S26: forming a passivation layer 209 on the base substrate, as shown in FIG. 7.

The process of forming the passivation layer 209, for instance, may be as follows: depositing a passivation layer material containing passivation groups on one side of the base substrate 201 away from the gate electrode 206, the source electrode 207, the drain electrode 208, the gate line and the data line at first and then subjected to an annealing process such as rapid thermal annealing and heat treatment furnace annealing to allow the passivating groups to enter the active layer 203 and the storage electrode 204 to restore the internal crystal defect therein and enter the interfaces of the active layer 203 and the storage electrode 204 and other layers to restore the interface defect, so as to achieve the objective of improving the TFT characteristics.

The material for preparing the passivation layer 209, for instance, may be a hydrogen-containing silicon nitride film (taking hydrogen as the passivating group). The thickness may, for instance, be 200 nm to 500 nm.

S27: patterning the passivation layer 209 by one patterning process, and forming a source contact hole through which the source electrode 207 and the active layer 203 are partially exposed, a drain contact hole through which the drain electrode 208 and the active layer 203 are partially exposed, and bridge structure contact holes through which the disconnected gate line or data line are partially exposed.

In the embodiment, the above step S27, for instance, may include the following steps S271 and S272.

Figure 8:
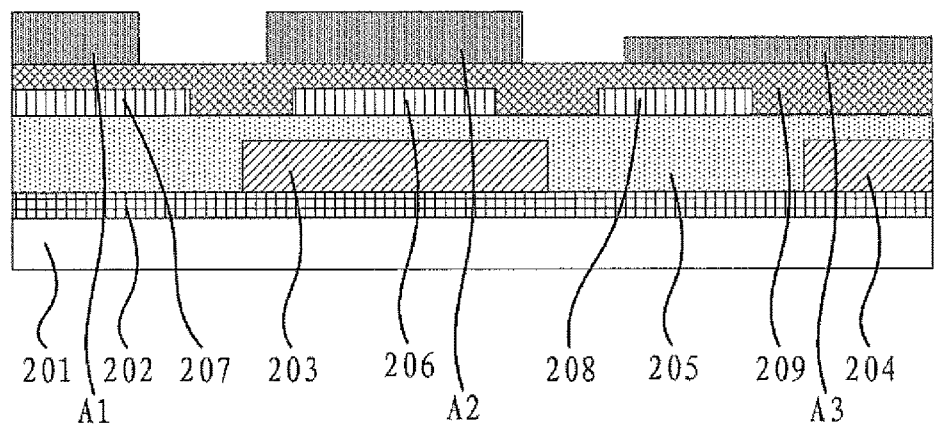

S271: forming a first photoresist layer A1 for covering the source electrode 207 and the data line, a second photoresist layer A2 for covering the gate electrode 206 and the gate line, and a third photoresist layer A3 for covering the drain electrode 208 on the passivation layer 209 via a semi-transparent type mask, as shown in FIG. 8, in which both the thickness of the first photoresist layer A1 and the thickness of the second photoresist layer A2 are greater than that of the third photoresist layer A3.

The adopted semi-transparent type mask is provided with regions corresponding to the source contact hole pattern to be formed and the drain contact hole pattern to be formed and, for instance, may be a half-tone mask, a gray-tone mask, etc. The photoresist layers with different thicknesses can be formed on the passivation layer 209 by utilization of the characteristic of different transmittances of specific regions of the semi-transparent type mask: both the thickness of the first photoresist layer A1 and the thickness of the second photoresist layer A2 are greater than that of the third photoresist layer A3.

The third photoresist layer A3 covers the drain electrode 208 and an adjacent pixel electrode region to be formed, and the thickness of the third photoresist layer A3, for instance, may be 0.5 μm to 1 μm. The first photoresist layer A1 and/or the second photoresist layer A2 cover regions except a source contact hole region to be formed, a drain contact hole region to be formed and a bridge structure contact hole region to be formed. The first photoresist layer A1 covers the source electrode 207 and the data line connected therewith, and the thickness of the first photoresist layer A1, for instance, may be 1 μm to 3 μm. The second photoresist layer A2 covers the gate electrode 206 and the gate line connected therewith, and the thickness of the second photoresist layer A2, for instance, may be 1 μm to 3 μm. The thickness of the first photoresist layer A1 and the thickness of the second photoresist layer A2 may be equal to each other and may also be unequal to each other.

Figure 9:
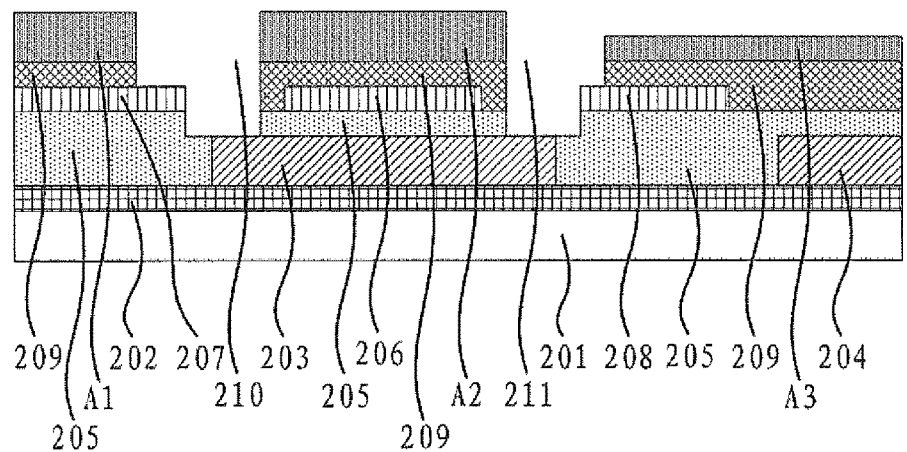

S272: removing the exposed passivation layer and the gate insulating layer between the exposed passivation layer and the base substrate 201 by taking the first photoresist layer A1, the second photoresist layer A2 and the third photoresist layer A3 as masks, and forming the source contact hole 210 through which the source electrode 207 and the active layer 203 are partially exposed, the drain contact hole 211 through which the drain electrode 208 and the active layer 203 are partially exposed, and bridge structure contact holes (not shown in the figure) through which the disconnected gate line or data line is partially exposed, as shown in FIG. 9.

In the step, the exposed passivation layer and the gate insulating layer between the exposed passivation layer and the base substrate 201 refer to the passivation layer and the gate insulating layer in the source contact hole region to be formed, the drain contact hole region to be formed, the bridge structure contact hole region to be formed.

In the step, the source contact hole, the drain contact hole and the bridge structure contact holes may be formed by, for instance, a dry etching process. In the beginning, the exposed passivation layer 209 is etched. When the surface of the layer comprising the source electrode 207, the drain electrode 208, the gate line and the data line is etched, as different materials have different etching speeds and the selection ratio of etching of the material (usually a metal) for forming the source electrode 207, the drain electrode 208, the gate line and the data line is less than that of the material of the passivation layer, the material for forming the source electrode 207, the drain electrode 208, the gate line and the data line will not be removed or only the material removed in a very limited degree, but the material of the passivation layer in the source contact hole region to be formed, the drain contact hole region to be formed and the bridge structure contact hole regions to be formed in the layer comprising the source electrode 207, the drain electrode 208, the gate line and the data line will be etched, and hence stepped structures are formed at the positions of the source electrode 207 and the drain electrode 208 and the surfaces of the source electrode 207 and the drain electrode 208 are partially exposed, and meanwhile, the surfaces of the disconnected gate line or data line are partially exposed and the bridge structure contact holes are formed. In the subsequent downward etching process, the material of the gate insulating layer 205 in the source contact hole region to be formed and the drain contact hole region to be formed, not shielded by the source electrode 207 and the drain electrode 208, is removed, and the etching process is complete until the surface of the active layer 203 are exposed, and hence the source contact hole 210 and the drain contact hole 211 are formed.

In the step, the adopted dry etching process, for instance, may be an etching process such as inductively coupled plasma etching.

S28: forming a transparent conductive film on the base substrate, partially removing the transparent conductive film by a film stripping process, and forming a source contact portion electrically connected with the source electrode 207 and the active layer 203 in the source contact hole 210 and a drain contact portion electrically connected with the drain electrode 208 and the active layer 203 in the drain contact hole 211, forming a pixel electrode electrically connected with the drain contact portion on the passivation layer on the drain electrode 208, and forming a bridge structure electrically connected with the disconnected gate line or data line in the bridge structure contact holes and on the passivation layer.

In the embodiment, the above step S28, for instance, may include the following steps S281 to S283.

Figure 10:
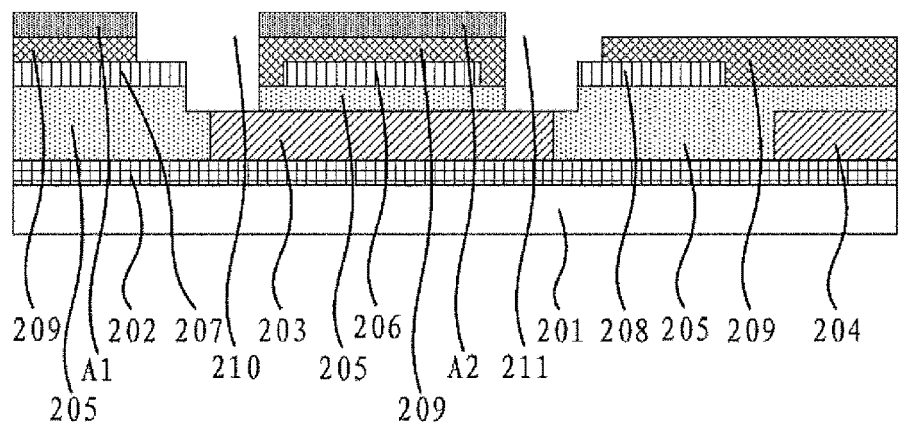

S281: removing the third photoresist layer A3, as shown in FIG. 10.

In the step, for instance, the third photoresist layer A3 may be removed by an ashing process such as plasma ashing. As both the thickness of the first photoresist layer A1 and the thickness of the second photoresist layer A2 are greater than that of the third photoresist layer A3, in the process of removing the photoresist layer, although the first photoresist layer A1 and the second photoresist layer A2 are partially removed, a certain thickness of the first photoresist layer A1 and a certain thickness of the second photoresist layer A2 is still kept to cover the source electrode 207 and the gate electrode 206. The residual first photoresist layer A1 and the residual second photoresist layer A2 may be taken as stripping layers in the subsequent step.

Figure 11:
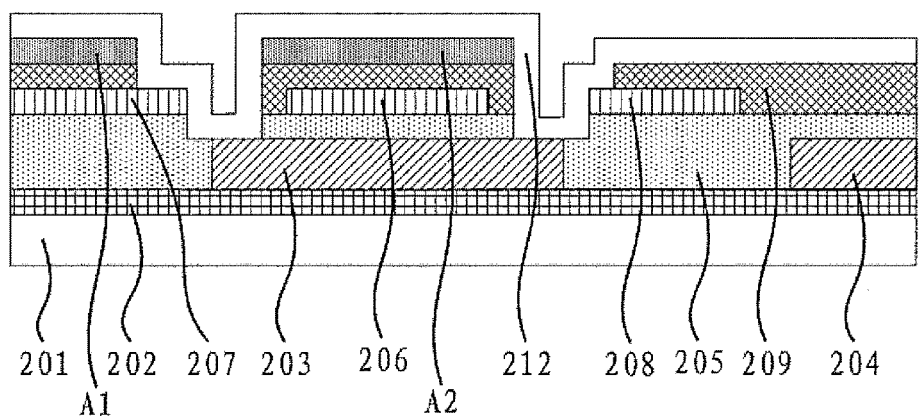
Figure 12:
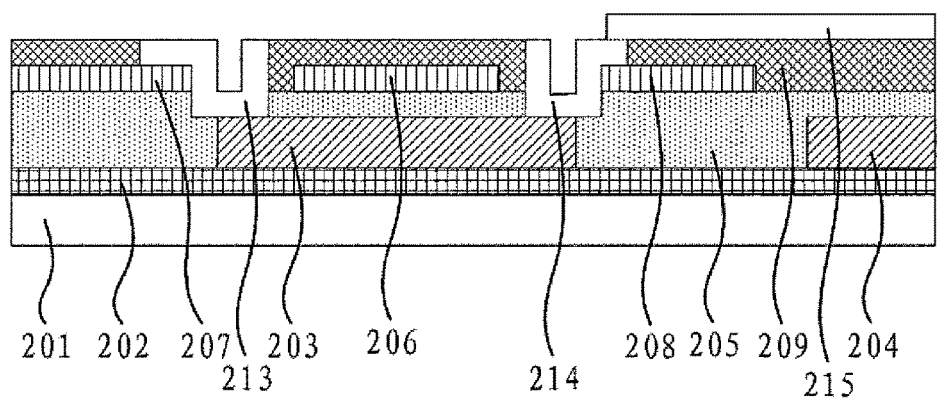

S282: forming a transparent conductive film 212 on the base substrate, as shown in FIG. 11.

In the step, the transparent conductive film 212, for instance, may be formed by process such as magnetron sputtering and chemical vapor deposition (CVD).

The thickness, the preparation material and the specific structure of the transparent conductive film 212 may be correspondingly selected according to actual requirements. No limitation will be given here in the embodiment of the present invention. The thickness of the transparent conductive film 212, for instance, may be 20 nm to 150 nm. The material for forming the transparent conductive film 212, for instance, may be one or any combination of more selected from indium tin oxide (ITO), indium zinc oxide (IZO), zinc tin oxide (ZTO), Ag, Al and Au. The structure of the transparent conductive film 212, for instance, may be a single-layer film structure or a composite structure formed by thin film layers.

For instance, when the manufactured array substrate is applied to a bottom-emission active-matrix organic light-emitting diode (AMOLED) display device, the transparent conductive film 212 is, for instance, an oxide transparent conductive film made from ITO, IZO, ZTO or the like, and the thickness of the transparent conductive film 212 is, for instance, 20 nm to 100 nm. When the manufactured array substrate is applied to a top-emission AMOLED display device, the transparent conductive film 212 is, for instance, a composite film formed by an ITO film, a silver (Ag) film and an ITO film, a composite film formed by an IZO film and an Ag film, or other composite film. In the transparent conductive film 212, the thickness of the ITO film, for instance, may be 10 nm to 50 nm, and the thickness of the Ag film, for instance, may be 20 nm to 100 nm.

S283: stripping off the first photoresist layer A1 and the second photoresist layer A2 to remove the transparent conductive film covering surfaces of the first photoresist layer A1 and the second photoresist layer A2, forming a source contact portion 213 electrically connected with the source electrode 207 and the active layer 203 in the source contact hole 210 and a drain contact portion 214 electrically connected with the drain electrode 208 and the active layer 203 in the drain contact hole 211, forming a pixel electrode 215 electrically connected with the drain contact portion 213 on the passivation layer 209 on the drain electrode 208, and forming the bridge structure electrically connected with the disconnected gate line or data line in the bridge structure contact holes and on the passivation layer above.

For instance, the base substrate formed with the transparent conductive film 212 may be placed into a stripping machine; the residual first photoresist layer A1 and the residual second photoresist layer A2 are removed by a photoresist stripping liquid; the transparent conductive film covering the first photoresist layer A1 and the second photoresist layer A2 is removed by film stripping process at the same time; and the transparent conductive film in the source contact hole 210, the drain contact hole 211 and the pixel electrode region to be formed is retained. The transparent conductive film in the source contact hole 210 is taken as the source contact portion 213 and electrically connected with the source electrode 207 and the active layer 203; the transparent conductive film in the drain contact hole 211 is taken as the drain contact portion 214 and electrically connected with the drain electrode 208 and the active layer 203; the transparent conductive film, on the passivation layer, in the pixel electrode region to be formed adjacent to the drain electrode 208 is taken as the pixel electrode 215 and electrically connected with the drain electrode 208; and meanwhile, the pixel electrode 215 and the storage electrode 204 cooperate to form a storage capacitor which is configured to maintain the previous frame in the process of switching two adjacent frames.

Figure 22:
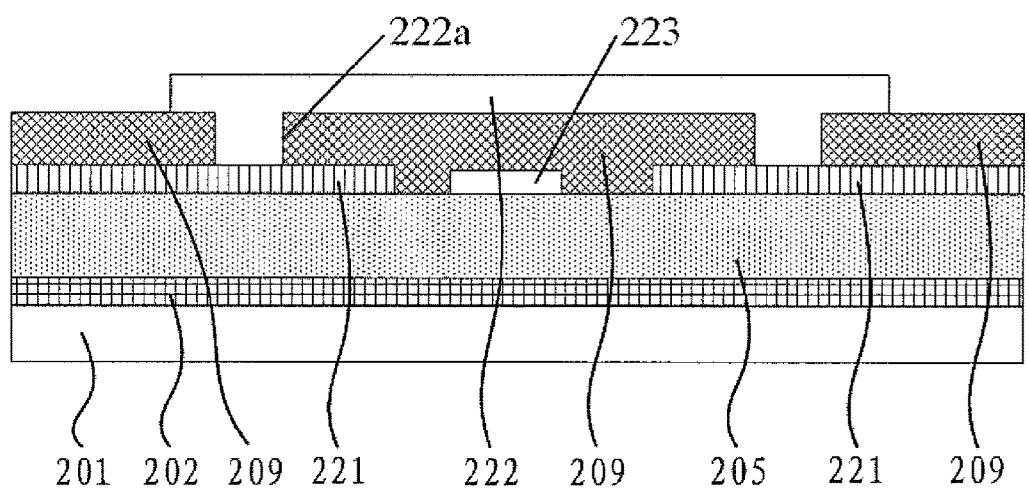
FIG. 22 is a schematic diagram illustrating the step of electrically connecting disconnected data lines in the method for manufacturing the array substrate provide by the first embodiment of the present invention.

It should be noted that: in the embodiment, the gate line and the data line are formed in the same photolithographic step with the gate electrode 206, the source electrode 207 and the drain electrode 208, and the data line or the gate line must be disconnected at the intersections of the data line and the gate line. Taking the case that the gate line is continuous and the data line is disconnected at the intersection of the data line and the gate line as an example, as illustrated in FIG. 22, after the passivation layer 209 is deposited, the bridge structure contact holes must be formed at disconnected positions, and hence disconnected portions of the data line 221 are electrically connected with each other through bridge structure 222 to achieve the electric insulation between the data line 221 and gate line 223. Bridge structure contact holes 222a which must be formed for the electrical connection of the disconnected data line 221 are formed at the same time with the source contact hole 210 and the drain contact hole 211. The bridge structure 222 filled into the bridge structure contact holes 222a and electrically connected with the disconnected portions of the data line 221 are formed by a portion of the transparent conductive film 212. The material of the transparent conductive film is filled into the bridge structure contact holes 222a at the same time when the transparent conductive film 212 is formed. The material of the transparent conductive film, required to be stripped off, on the periphery of the bridge structure 222 is stripped off at the same time when the first photoresist layer A1 and the second photoresist layer A2 are stripped off, and hence the bridge structure 222 electrically connected with the disconnected data line 221 is formed.

In the embodiment, as described in the above steps S27 and S28, at first, the photoresist layers with different thicknesses are formed by a semi-transparent type mask; the source contact hole and the drain contact hole are formed by etching; the photoresist layer with a small thickness in the pixel electrode region to be formed is removed; subsequently, the transparent conductive film is formed; the photoresist layer with a large thickness on the source electrode 207 and the gate electrode 206 and the transparent conductive film covering this photoresist layer are removed together by a film stripping process; the pixel electrode 215 is formed; and the electrical connection between the source electrode 207 and the drain electrode 208 and the active layer 203 is achieved. Thus, the two patterning processes, required to be performed in the step of forming the source contact hole and the drain contact hole and the step of forming the pixel electrode contact hole in the method for manufacturing the array substrate as shown in FIG. 1, are combined into one patterning process, and hence the manufacturing steps of the array substrate can be simplified and the productivity can be improved. Moreover, as the number of the patterning processes is reduced, the problem of alignment error caused by patterning processes can be avoided to some extent, and hence the yield of products can be improved.

Figure 13:
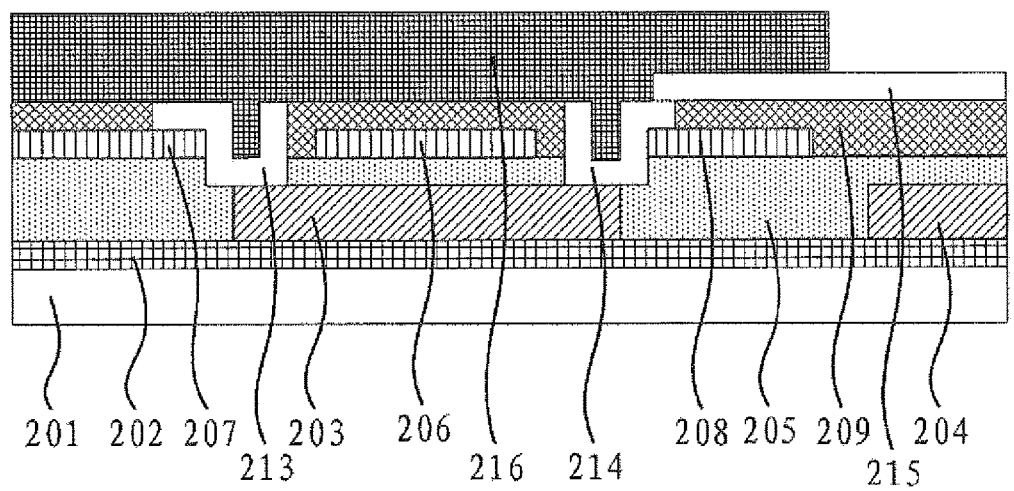

S29: forming a pixel define layer 216 on the base substrate, as shown in FIG. 13.

For instance, the material of the pixel define layer is deposited on the base substrate obtained after the step S28; a photoresist mask provided with a pattern of the pixel define layer is formed by a patterning process; the etching process is performed; the material of the pixel define layer, outside the pixel define layer to be formed, is removed; and hence the pixel define layer 216 is formed.

The material for preparing the pixel define layer 216, for instance, may be acrylic material and the like, and the thickness of the pixel define layer 216 is, for instance, 1 μm to 4 μm.

After the pixel define layer 216 is prepared, for instance, the finished array substrate may be subjected to an annealing process by a rapid thermal annealing furnace or a heat treatment furnace so as to stabilize the properties of TFTs.

It should be noted that: the manufacturing method provided by the embodiment may be applied to the manufacturing of an LTPS TFT array substrate, but the range of application of the manufacturing method provided by the embodiment should not be limited; and under the premise of unchanged concept of the present invention, the manufacturing method provided by the embodiment can also be applied to the manufacturing of an a-Si TFT array substrate, an HTPS TFT array substrate, an oxide TFT array substrate, an organic TFT array substrate, etc.

In the method for manufacturing the array substrate, provided by an embodiment, the gate electrode, the source electrode, the drain electrode, the gate line and the data line are formed at the same time by same one patterning process; the interlayer insulating layer between the gate electrode and the source/drain electrode is not required; and two patterning processes, required to be used in the step of forming the gate electrode and the gate line and the step of forming the source/drain electrode and the data line in the method for manufacturing the array substrate as shown in FIG. 1, are combined into one patterning process.

Moreover, in the embodiment, the source contact hole and the drain contact hole of which the bottoms are provided with stepped structures are formed by same one patterning process, and meanwhile the bridge structure contact holes are formed; and the electrical connection between the source/drain electrodes and the active layer and the electrical connection between the disconnected portion of the gate line or data line are achieved at the same time when the pixel electrodes are formed, by the one deposition process of the transparent conductive film, in combination with the film stripping process. Therefore, two patterning processes, required to be used in the step of forming the source contact hole and the drain contact hole and the step of forming the pixel electrode contact hole in the method for manufacturing the array substrate as shown in FIG. 1, are combined into one patterning process.

In the embodiment, the photoresist layers with different thicknesses are formed by a semi-transparent type mask; the patterns of the active layer and the storage electrode are formed by etching; the photoresist layer with a small thickness is removed by an ashing process; and the pattern of the storage electrode is doped to foul' the storage electrode. Therefore, two patterning processes, required to be used in the etching of the poly-Si layer and the doping of the storage electrodes in the method for manufacturing the array substrate as shown in FIG. 1, are combined into one patterning process.

Obviously, the manufacturing method provided by the embodiment can reduce the 8~9 patterning processes required to be used in the method for manufacturing the array substrate as shown in FIG. 1 to four (4) patterning processes and hence can simplify the manufacturing steps of the array substrate and improve productivity. Moreover, as the number of the patterning processes is reduced, the problem of alignment error caused by multiple high-accuracy alignment in multiple photolithographies can be effectively improved, and hence the yield of products can be improved.

Second Embodiment

The present embodiment provides an array substrate. As illustrated in FIG. 13, the array substrate provided by the embodiment comprises: an active layer 203 disposed on a base substrate 201; a gate insulating layer 205 for covering the active layer 203; a gate electrode 206, a source electrode 207, a drain electrode 208, a gate line and a data line disposed on the gate insulating layer 205 and arranged in the same layer, in which the gate line or the data line is disconnected at the intersection of the gate line and the data line; a passivation layer 209 for covering the gate electrode 206, the source electrode 207, the drain electrode 208, the gate line and the data line; a source contact hole, a drain contact hole and bridge structure contact holes disposed in the passivation layer 209 and the gate insulating layer 205, in which the source electrode 207 and the active layer 203 are partially exposed by the source contact hole, the drain electrode 208 and the active layer 203 are partially exposed by the drain contact hole, and the disconnected gate line or data line is partially exposed by the bridge structure contact holes; and a source contact portion 213, a drain contact portion 214, a pixel electrode 215 and a bridge structure arranged in the same layer. The source contact portion 213 is disposed in the source contact hole and electrically connected with the source electrode 207 and the active layer 203; the drain contact portion 214 is disposed in the drain contact hole and electrically connected with the drain electrode 208 and the active layer 203; the pixel electrode 215 is disposed on the passivation layer 209 on the drain electrode 208 and electrically connected with the drain electrode 208 through the drain contact portion 214; and the bridge structure is disposed in the bridge structure contact holes and on the passivation layer and electrically connected with the disconnected gate line or data line.

The position relationship among the active layer 203, the gate insulating layer 205, the gate electrode 206, the source electrode 207, the drain electrode 208, the gate line, the data line and the passivation layer 209, for instance, may be as shown in FIG. 13. That is to say, the active layer 203 is disposed on the base substrate 201; the gate insulating layer 205 is disposed on one side of the active layer 203 away from the base substrate 201; the gate electrode 206, the source electrode 207, the drain electrode 208, the gate line and the data line are disposed on one side of the gate insulating layer 205 away from the base substrate 201; and the passivation layer 209 is disposed on one side of the gate electrode 206, the source electrode 207, the drain electrode 208, the gate line and the data line away from the base substrate 201.

It should be noted that: description is given in the embodiment only by taking the position relationship among the layers as shown in FIG. 13 as an example; and in other embodiments of the present invention, the relative position among the active layer 203, the gate insulating layer 205, the gate electrode 206, the source electrode 207, the drain electrode 208, the gate line, the data line and the passivation layer 209 may also have other variations.

In the array substrate provided by the embodiment, as the gate electrode 206, the source electrode 207, the drain electrode 208, the gate line and the data line are arranged in the same layer, no overlapped portion is formed between the gate electrode 206 and the source electrode 207 and the drain electrode 208, namely there is no parasitic capacitance between the gate electrode 206 and the source electrode 207 and the drain electrode 208. But in the array substrate as shown in FIG. 1, as the gate electrode and the source/drain electrodes are arranged in different layers, parasitic capacitance is produced due to the overlapping of the gate electrode with the source/drain electrodes, and hence the electrical property of devices can be affected. Obviously, the array substrate provided by the embodiments has smaller parasitic capacitance and better electrical property. Moreover, compared with the array substrate as shown in FIG. 1, the above structure does not require the interlayer insulating layer between the gate electrode and the source/drain electrodes, reduces the usage amount of the materials to some extent, and hence reduces the manufacturing cost.

Moreover, in the array substrate provided by the embodiment, the source contact portion 213, the drain contact portion 214 and the pixel electrode 215 are arranged in the same layer, namely are formed in the same step, which is equivalent to combine, the step of filling the conductive material into the source contact hole and the drain contact hole to achieve the electrical connection between the source/drain electrodes and the active layer and the step of forming the pixel electrode in the method for manufacturing the array substrate as shown in FIG. 1, into one step. Furthermore, in the embodiment, surfaces of the source electrode and the active layer are exposed by the source contact hole; surfaces of the drain electrode and the active layer are exposed by the drain contact hole; and the pixel electrode 215 are electrically connected with the drain electrode 208 through the drain contact portion 214 in the drain contact hole. That is to say, the drain contact hole in the embodiment also functions as pixel electrode contact hole. Thus, the step of forming the pixel electrode contact hole in the method for manufacturing the array substrate as shown in FIG. 1 can be omitted. Obviously, the array substrate provided by the embodiment has the advantages of simple manufacturing method and high productivity.

Meanwhile, as the patterning process requires higher alignment accuracy and high alignment accuracy results in large alignment difficulty, the problem of alignment error can be easily caused by multiple patterning processes, and hence the yield of devices can be reduced. The array substrate provided by the embodiments can be manufactured by less patterning processes, can improve the problem of alignment error by reducing the number of the patterning processes, and hence can have higher yield.

No limitation is given in the embodiments to the materials of the gate electrode 206, the source electrode 207, the drain electrode 208, the gate lines and the data lines, which, for instance, may include at least one or a combination of more selected from aluminum, copper, molybdenum, titanium and aluminum neodymium compound, so as to achieve better conductive effect.

In addition, in the embodiment, the thickness of the source contact portion 213, the drain contact portion 214, the pixel electrode 215 and the bridge structure may, for instance, be 20 nm to 150 nm, and hence better conductive effect can be achieved.

Compared with the array substrate as shown in FIG. 1, the array substrate provided by one example of the embodiment can omit the preparation of a planarization layer after the forming of the passivation layer 209 and hence can save the materials, reduce the costs and simplify the processes. Based on the concept, the material of the passivation layer 209 in the embodiment, for instance, may adopt the same material as the planarization layer, e.g., acrylic material, to planarize the surface of the base substrate at the same time when isolating an upper layer and a lower layer of the planarization layer.

The array substrate provided by one example of the embodiment, for instance, may further comprise: the storage electrode 204 arranged in the same layer as the active layer 203. The storage electrode 204, for instance, may be formed in the same step as the active layer 203 and is overlapped with the pixel electrode 215 to form a storage capacitor which is configured to maintain the display of the previous frame in the case of switching two frames.

In the embodiment, the array substrate may further comprise: a buffer layer 202 disposed between the base substrate 201 and the active layer 203 to protect the base substrate 201. The buffer layer 202, for instance, may include a silicon nitride film and a silicon oxide film. The silicon nitride film, for instance, may be closer to the base substrate 201 compared with the silicon oxide film. The silicon nitride film has strong diffusion resistance and can prevent metallic ions from affecting a subsequently formed poly-Si film. The silicon oxide film can form a good interface together with the subsequently formed poly-Si film, and hence the damage of the silicon nitride film on the quality of the poly-Si film can be avoided.

In addition, the array substrate provided by one example of the embodiment may further comprise: a pixel define layer 216 for covering the source contact portion 213, the drain contact portion 214 and the bridge structure. The pixel define layer 216 is configured to maintain the mutual electric insulation between the source electrode 207 and the drain electrode 208 and film layers formed on the pixel define layer 216, is formed on the periphery of the pixel electrode 215, and is also configured to define pixel regions. The pixel define layer 216 may be made from the same material as the planarization layer and, for instance, may be made from an acrylic material and the like to planarize the surface of the base substrate.

The array substrate provided by the embodiment, for instance, may be an LTPS TFT array substrate and may also be an a-Si TFT array substrate, an HTPS TFT array substrate, an oxide TFT array substrate, an organic TFT array substrate or the like in other embodiments of the present invention. No limitation will be given here.

Third Embodiment

The present embodiment provides a display device on the basis of the second embodiment. The display device comprises the array substrate provided by the second embodiment.

For instance, the display device provided by the embodiment may, for instance, be an OLED display device, e.g., an AMOLED display device. The display device may also be an LCD, e.g., an in-plane switching (IPS) LCD.

As gate electrodes and source/drain electrodes of TFTs of the display device provided by the embodiment are arranged in the same layer, there is no parasitic capacitance between the gate electrodes and the source/drain electrodes, and hence the properties of the display device can be improved.

Moreover, as the array substrate of the display device provided by the embodiment can be manufactured by less patterning processes, the productivity of the display device become higher. Meanwhile, as the problem of alignment error can be improved by reducing the number of the patterning processes, the display device provided by the embodiment has a higher yield.

Furthermore, as the TFT in the display device provided by the embodiment is not provided with an interlayer insulating layer between the gate electrode and the patterns of the source electrode and the drain electrode, the usage amount of materials can be reduced. Therefore, the display device provided by the embodiment has the advantages of reduced manufacturing cost and simplified processing steps.

Fourth Embodiment

The embodiment of the present invention provides a thin film transistor (TFT), which comprises: an active layer disposed on a base substrate; a gate insulating layer for covering the active layer; a gate electrode, a source electrode and a drain electrode disposed on the gate insulating layer and arranged in the same layer; a passivation layer for covering the gate electrode, the source electrode and the drain electrode; a source contact hole and a drain contact hole disposed in the passivation layer and the gate insulating layer, in which the source electrode and the active layer are partially exposed by the source contact hole, and the drain electrode and the active layer are partially exposed by the drain contact hole; and a source contact portion and a drain contact portion arranged in the same layer, in which the source contact portion is disposed in the source contact hole and electrically connected with the source electrode and the active layer, and the drain contact portion is disposed in the drain contact hole and electrically connected with the drain electrode and the active layer.

The embodiment of the present invention further provides a method for manufacturing a thin film transistor (TFT), which comprises: forming a pattern of an active layer and a gate insulating layer on a base substrate; forming a metal film on the gate insulating layer, patterning the metal film by one patterning process, and forming patterns of a gate electrode, a source electrode and a drain electrode; forming a passivation layer on the base substrate; patterning the passivation layer by one patterning process, and forming a source contact hole through which the source electrode and the active layer are partially exposed and a drain contact hole through which the drain electrode and the partial active layer are partially exposed; and forming a conductive film on the base substrate, removing partially conductive film, and forming a source contact portion electrically connected with the source electrode and the active layer in the source contact hole and a drain contact portion electrically connected with the drain electrode and the active layer in the drain contact hole.

In one example, the conductive film may adopt the above transparent conductive film.

The implementation of the TFT and the manufacturing method thereof provided by the embodiment may refer to relevant description of the array substrate. No further description will be given here.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The application claims priority to the Chinese patent application No. 201410226956.3, filed May 27, 2014, the disclosure of which is incorporated herein by reference as part of the application.

The invention claimed is:

1. A method for manufacturing an array substrate, comprising:

forming a pattern of an active layer and a gate insulating layer on a base substrate;

forming a metal film on the gate insulating layer, patterning the metal film by one patterning process, and forming patterns of a gate electrode, a source electrode, a drain electrode, a gate line and a data line, in which the gate line or the data line is disconnected at an intersection of the gate line and the data line;

forming a passivation layer on the base substrate;

patterning the passivation layer by one patterning process, and forming a source contact hole through which the source electrode and the active layer are partially exposed, a drain contact hole through which the drain electrode and the active layer are partially exposed, and bridge structure contact holes through which the disconnected gate line or data line is partially exposed; and forming a transparent conductive film on the base substrate, removing partially the transparent conductive film to form a source contact portion electrically connected with the source electrode and the active layer in the source contact hole and a drain contact portion electrically connected with the drain electrode and the active layer in the drain contact hole, forming a pixel electrode electrically connected with the drain contact portion on the passivation layer on the drain electrode, and forming a bridge structure electrically connected with the disconnected gate line or data line in the bridge structure contact holes and on the passivation layer above.

2. The method for manufacturing the array substrate according to claim 1, wherein a first photoresist layer for covering the source electrode and the data line, a second photoresist layer for covering the gate electrode and the gate line, and a third photoresist layer for covering the drain electrode are formed on the passivation layer via a semi-transparent type mask, and both a thickness of the first photoresist layer and a thickness of the second photoresist layer are greater than that of the third photoresist layer; and the exposed passivation layer and the gate insulating layer between the exposed passivation layer and the base substrate are removed by taking the first photoresist layer, the second photoresist layer and the third photoresist layer as masks to form the source contact hole through which the source electrode and the active layer are partially exposed, the drain contact hole through which the drain electrode and the active layer are partially exposed, and the bridge structure contact holes through which the disconnected gate line or data line are partially exposed.

3. The method for manufacturing the array substrate according to claim 2, wherein the exposed passivation layer and the gate insulating layer between the exposed passivation layer and the base substrate are etched via a dry etching process by taking the first photoresist layer, the second photoresist layer and the third photoresist layer as the masks.

4. The method for manufacturing the array substrate according to claim 2, wherein the third photoresist layer is removed;

a transparent conductive film is formed on the base substrate; and the first photoresist layer and the second photoresist layer are stripped off to remove the transparent conductive film covering surfaces of the first photoresist layer and the second photoresist layer to form the source contact portion, the drain contact portion, the pixel electrode and the bridge structure.

5. The method for manufacturing the array substrate according to claim 1, wherein a pattern of a storage electrode is also formed at the same time when the pattern of the active layer is formed on the base substrate.

6. The method for manufacturing the array substrate according to claim 5, wherein a polycrystalline silicon (poly-Si) layer is formed on the base substrate and patterned by one patterning process to form the pattern of the active layer and the pattern of the storage electrode.

7. The method for manufacturing the array substrate according to claim 6, wherein
the poly-Si layer is formed on the base substrate;
a fourth photoresist layer for covering a region of the active layer to be formed and a fifth photoresist layer for covering a region of a storage electrode to be formed are formed on the poly-Si layer via a semi-transparent type mask, and a thickness of the fourth photoresist layer is greater than that of the fifth photoresist layer;
the exposed poly-Si layer is removed by taking the fourth photoresist layer and the fifth photoresist layer as masks to form the pattern of the active layer and the pattern of the storage electrode;
the fifth photoresist layer is removed and the pattern of the storage electrode is doped by taking the fourth photoresist layer as a mask; and
the fourth photoresist layer is removed.

8. The method for manufacturing the array substrate according to claim 6, wherein
an a-Si material is deposited on the base substrate; and
the a-Si material is converted into a poly-Si material by a crystallization process to form the poly-Si layer.

9. The method for manufacturing the array substrate according to claim 1, before the step of forming the pattern of the active layer on the base substrate, further comprising:
forming a buffer layer on the base substrate.

10. The method for manufacturing the array substrate according to claim 1, after the step of forming the source contact portion, the drain contact portion and the pixel electrode, further comprising:
forming a pixel define layer on the base substrate.

11. A method for manufacturing a thin film transistor (TFT), comprising:
forming a pattern of an active layer and a gate insulating layer on a base substrate;
forming a metal film on the gate insulating layer, patterning the metal film by one patterning process, and forming patterns of a gate electrode, a source electrode and a drain electrode;
forming a passivation layer on the base substrate;
patterning the passivation layer by one patterning process, and forming a source contact hole through which the source electrode and the active layer are partially exposed and a drain contact hole through which the drain electrode and the active layer are partially exposed; and
forming a conductive film on the base substrate, partially removing the conductive film, and forming a source contact portion electrically connected with the source electrode and the active layer in the source contact hole and a drain contact portion electrically connected with the drain electrode and the active layer in the drain contact hole.

* * * * *